US010637419B2

(12) United States Patent
Abdullah et al.

(10) Patent No.: US 10,637,419 B2
(45) Date of Patent: Apr. 28, 2020

(54) ATTENUATOR CIRCUIT FOR AN ELECTRONIC DEVICE HAVING A BATTERY AND METHOD FOR CONTROLLING THE ELECTRONIC DEVICE

(71) Applicant: MOTOROLA SOLUTIONS, INC., Chicago, IL (US)

(72) Inventors: Mohd Faisal Abdullah, Penang (MY); Peter J. Bartels, Loxahatchee, FL (US); Marko Bursac, Libertyville, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/753,290

(22) PCT Filed: Aug. 28, 2015

(86) PCT No.: PCT/MY2015/000072
§ 371 (c)(1),
(2) Date: Feb. 17, 2018

(87) PCT Pub. No.: WO2017/039429
PCT Pub. Date: Mar. 9, 2017

(65) Prior Publication Data
US 2018/0248529 A1     Aug. 30, 2018

(51) Int. Cl.
*H03G 3/00*      (2006.01)
*G06F 1/3212*    (2019.01)
(Continued)

(52) U.S. Cl.
CPC .......... *H03G 3/007* (2013.01); *G06F 1/3212* (2013.01); *G06F 1/3234* (2013.01); *G06F 3/165* (2013.01);
(Continued)

(58) Field of Classification Search
CPC ........ H03G 3/007; H03G 7/002; H03G 7/007; H03G 5/005; H03G 3/20; H03G 3/001;
(Continued)

(56) References Cited

U.S. PATENT DOCUMENTS

| 5,263,092 A   | 11/1993 | Jang |
| 6,173,056 B1 * | 1/2001  | Romesburg ............ H03G 3/007 |
|               |         | 379/406.01 |

(Continued)

FOREIGN PATENT DOCUMENTS

| JP | 2006148671 | 6/2006 |
| WO | 00/11781   | 3/2000 |

OTHER PUBLICATIONS

PCT/MY2015/000072 International Search Report and Written Opinion of the International Searching Authority dated Aug. 2, 2016 (20 pages).

(Continued)

*Primary Examiner* — Disler Paul
(74) *Attorney, Agent, or Firm* — Michael Best & Friedrich LLP

(57) ABSTRACT

A method of controlling an electronic device having a battery and a speaker is disclosed. The method includes receiving an audio data signal, monitoring a battery-related parameter of the battery, determining whether the monitored battery-related parameter traverses a threshold, and bit-shifting the audio data signal based on the monitored battery-related parameter traversing the threshold. Also disclosed is an attenuator circuit for an electronic device having a battery.

15 Claims, 7 Drawing Sheets

(51) Int. Cl.
*G06F 1/3234* (2019.01)
*G06F 3/16* (2006.01)
*H03G 7/00* (2006.01)
*H04R 3/00* (2006.01)

(52) U.S. Cl.
CPC ............. *H03G 3/002* (2013.01); *H03G 7/002* (2013.01); *H03G 7/007* (2013.01); *H04R 3/00* (2013.01); *Y02D 10/174* (2018.01)

(58) Field of Classification Search
CPC ... H03G 3/3005; G06F 1/3212; G06F 1/3234; H04R 29/001; H04R 3/007; H04R 3/04
USPC ................ 381/58–59, 104–109, 55
See application file for complete search history.

(56) References Cited

U.S. PATENT DOCUMENTS

| | | | |
|---|---|---|---|
| 6,853,242 B2 | 2/2005 | Melanson et al. | |
| 7,583,213 B2 * | 9/2009 | Wang ..................... | H04L 27/08 341/139 |
| 7,697,704 B2 | 4/2010 | Brooks et al. | |
| 2006/0247920 A1 | 11/2006 | Toriyama | |
| 2007/0244587 A1 * | 10/2007 | Yamamoto ............. | H03G 3/001 700/94 |
| 2010/0050003 A1 * | 2/2010 | Liebenow ............. | G06F 1/3218 713/310 |
| 2012/0177226 A1 * | 7/2012 | Silverstein ............ | G06F 1/3212 381/107 |
| 2015/0032908 A1 * | 1/2015 | Remple ................. | G06F 13/385 710/14 |
| 2018/0358937 A1 * | 12/2018 | Nakata ..................... | H03F 1/52 |

OTHER PUBLICATIONS

Nagari et al. "An 8 Omega 2.5 W1%-THD 104 dB(A)-Dynamic-Range Class-D Audio Amplifier With Ultra-Low EMI System and Current Sensing for Speaker Protection," IEEE Journal of Solid-State Circuits, IEEE Service Center, Piscataway, NJ, USA, vol. 47, No. 12,1 (Dec. 1, 2012) pp. 3068-3080, XP011485432, ISSN: 0018-9200, DOI: 10.1109/JSSC.2012.2225762, Chapters I and II; abstract; figure 1.

* cited by examiner

ATTENUATOR CIRCUIT FOR AN ELECTRONIC DEVICE HAVING A BATTERY AND METHOD FOR CONTROLLING THE ELECTRONIC DEVICE

BACKGROUND OF THE INVENTION

Network convergence and converged devices are becoming more predominant. A converged device incorporates components (e.g., hardware and software) to permit communications via two or more modalities. For example, a converged device may incorporate components to support communications via a land-mobile radio (LMR) network and a long-term evolution (LTE) network. While converged devices provide a number of benefits in comparison to single-modality devices, concurrent operations of multiple modalities may cause excessive peak battery current events.

Accordingly, there is a need for a new and useful electronic device, such as a converged device, that has reduced excessive peak battery current events. Also, there is a need for a new and useful method for controlling the electronic device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
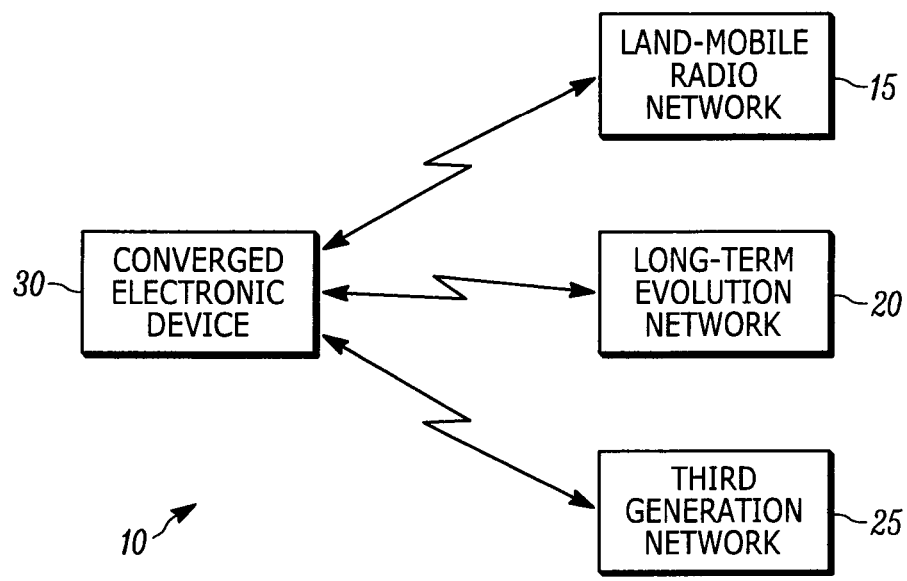
FIG. 1 is a block diagram representing a multiple network system.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

DETAILED DESCRIPTION OF THE INVENTION

One embodiment provides a method of controlling an electronic device with an attenuator circuit. The method includes receiving an audio data signal, monitoring a battery-related parameter of a battery of the electronic device, determining whether the monitored battery-related parameter traverses a threshold, and bit-shifting the audio data signal based on the monitored battery-related parameter traversing the threshold. The threshold may be progammably adjusted. The method can further include attenuating an output of a speaker of the electronic device in response to bit-shifting the audio data signal. The method can also include receiving an enable signal, wherein bit-shifting the audio data signal is further based on the enable signal.

In some embodiments, the monitored battery-related parameter includes at least one parameter from the group of a battery voltage, a current associated with the battery, and a battery temperature.

In yet other embodiments, the method provides a trip signal when the monitored battery-related parameter traverses the threshold. The bit-shifting the audio data signal is based on the trip signal. Further, the method can include pulse-stretching the trip signal.

In some embodiments, the method provides a second threshold for the battery-related parameter and performs an action with the electronic device when the battery-related parameter traverses the second threshold for a first time period. The determining whether the monitored battery-related parameter traverses a threshold and bit-shifting the audio data signal occurs in a second time period less than the first time period. The threshold and the second threshold can be the same. Also, the action can include at least one action from the group of resetting the electronic device and shutting down the electronic device.

In further embodiments, the method provides a zeroized signal and grounds the audio data signal based on the receipt of the zeroized signal.

Yet another embodiment provides an attenuator circuit for an electronic device having a battery. The attenuator circuit includes a sensor to monitor a battery-related parameter of the battery and to provide a sensor signal based on the battery-related parameter. The attenuator circuit also includes a comparator coupled to receive a reference voltage and coupled to the sensor. The comparator provides a trip signal based on a comparison of the reference voltage and the sensor signal. The attenuator circuit includes an audio data signal input to receive an audio data signal, and a bit shifter coupled to the audio data signal input. The bit shifter provides an attenuated audio data signal. The attenuator circuit further includes a switch coupled to the audio data signal input, the bit shifter, and the comparator. The switch provides one of the audio data signal and the attenuated audio data signal to the audio data signal output based on the trip signal. The attenuator circuit includes an audio data signal output coupled to the switch to provide one of the audio data signal and the attenuated audio data signal.

In some embodiments, the attenuator circuit further includes an AND gate receiving an enable signal and the trip signal. The AND gate provides a trigger signal based on the enable signal and the trip signal. The bit shifter provides the attenuated audio data signal based on the trigger signal.

In further embodiments, the attenuator signal includes a pulse stretching circuit coupled to the bit shifter. The pulse stretching circuit has an OR gate and a resistor-capacitor (RC) circuit. The pulse stretching circuit controls the bit shifter based on the trip signal.

In some embodiments, the bit shifter includes a D flip-flop for bit shifting the audio data signal. The attenuator circuit further includes a second D flip-flop for providing word synchronization and a third D flip-flop for detecting the most significant bit of a word.

In embodiments, a method of controlling an electronic device with an attenuator circuit is disclosed. The method includes receiving an audio data signal, monitoring a battery-related parameter of a battery of the electronic device, receiving a first threshold for the battery-related parameter, performing an action with the electronic device when the battery-related parameter traverses the first threshold for a first time period, determining whether the monitored battery-related parameter traverses a second threshold, and muting the audio data signal based on the monitored battery-related parameter traversing the second threshold. The muting the audio data signal occurs in a second time period less than the first time period.

FIG. 1 illustrates a block diagram representing a multiple network system 10. The multiple network system 10 includes a land-mobile radio (LMR) network 15, a long-term evolution (LTE) network 20, and a third generation (3G) of mobile telecommunications technology network 25. The provided networks are exemplary—other networks, including future developed networks, can be employed in the multiple network system 10. Further, all three disclosed networks need not be present. Also, one skilled in the art would understand that the networks are more complex than the high-level boxes shown in FIG. 1. A converged electronic device 30 communicates with the networks 15, 20, and 25. An exemplary converged electronic device 30 may be a smart telephone that can communicate with the networks 15, 20, and 25. As will be apparent below, however, aspects of the invention may be used in other electronic devices, such as other electronic devices that include a power amplifier and can benefit from reducing current usage to limit battery disconnection.

In a converged electronic device 30, an example scenario involves the converged electronic device 30 conducting a real-time video call with high data transmission on the long-term evolution network 20 and with substantial audio output to the speaker of the converged electronic device 30. The scenario then involves the converged electronic device 30 receiving an affiliation request from the land-mobile radio network 15. By one current standard, the converged electronic device 30 must respond to the affiliation request in a defined time period. The occurrence of the affiliation request and the response during the video call may cause overuse of the battery of the converged electronic device 30.

Figure 2:
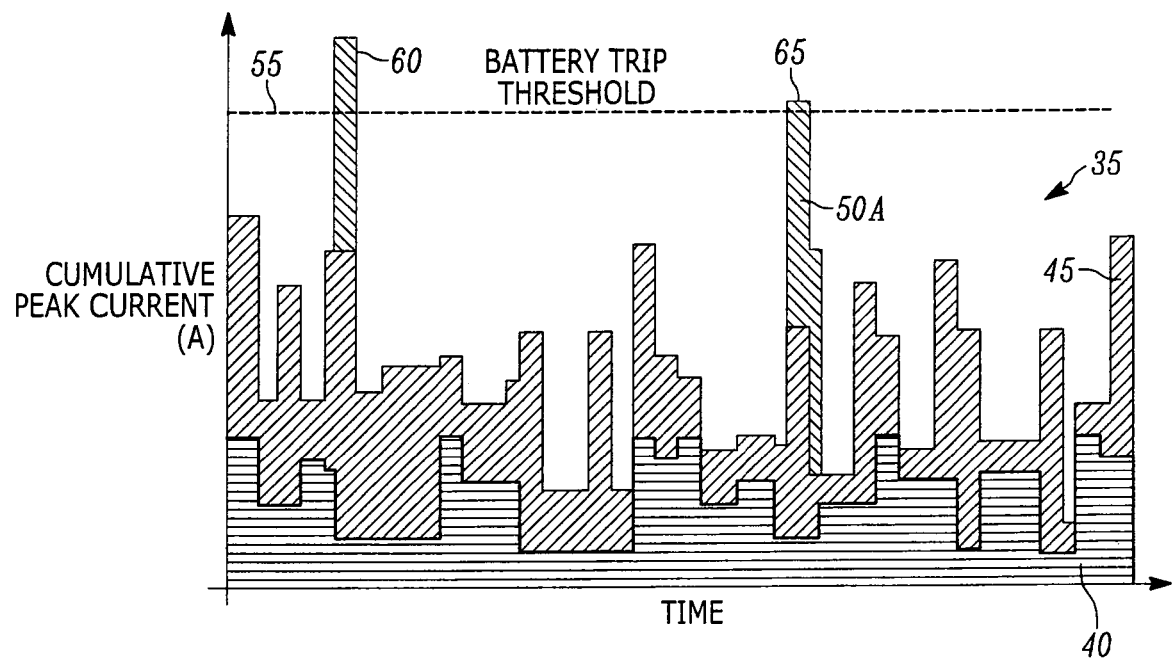
FIG. 2 is a chart showing a cumulative peak current over time for a converged electronic device of the prior art in a hypothetical scenario.

For example, FIG. 2 is a chart 35 showing a cumulative peak current over time for a converged electronic device of the prior art in the example scenario. The lower portion 40 of the cumulative peak current is the current associated with the long-term evolution real-time video call. The current can be used, for example, with the baseline processing and transceiver power of the converged electronic device. The middle portion 45 of the cumulative peak current is the current associated with an audio speaker of the converged electronic device. The upper portion 50A of the cumulative peak current is the current associated with the land-mobile radio network affiliation event. Also shown in FIG. 2 is a battery trip threshold 55. It is common for a converged electronic device to reset or power down when the cumulative peak current exceeds the battery trip threshold 55 for a defined time period. For example, the time period may be 280 microseconds (µs) and the land-mobile radio network affiliation event may be 40 milliseconds (ms). The provided times are for demonstration only. At periods 60 and 65 the cumulative peak currents of the converged electronic device exceed the battery's capacity to source adequately. Consequently, battery damage and/or a device reset may occur.

Before proceeding further, one skilled in the art will understand that the provided scenario is exemplary and should not be construed to be the sole peak current issue that a converged electronic device 30 may experience. It should also be understood that the disclosed peak current issue occurs in other electronic devices.

Figure 3:
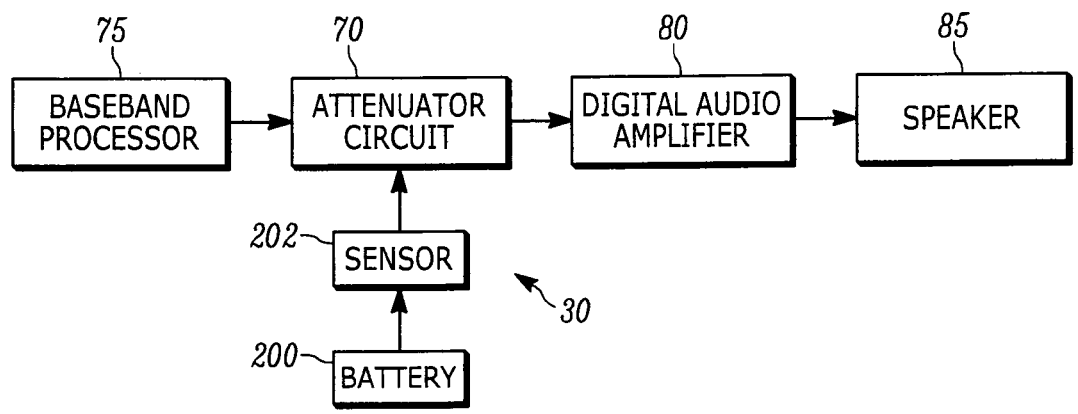
FIG. 3 is a block diagram representing a portion of a converged electronic device in accordance with some embodiments.

A portion of a converged electronic device 30 to address the scenario of FIG. 2 in accordance with some embodiments is shown in FIG. 3. With reference to FIG. 3, an attenuator circuit 70 couples a baseband processor 75 to a digital audio amplifier 80. FIG. 3 is a high-level block diagram of a portion of converged electronic device 30. One skilled in the art would understand the converged electronic device 30 may include other components or elements, such as, without limitation, an antenna, an radio frequency (RF) transceiver, a modem, a subscriber identity module, other processors and/or chipsets, other sensors, a user interface, a microphone, and the like. Digital audio from the baseband processor 75 can be attenuated with the attenuator circuit 70 based on a sensed battery parameter. The inclusion of the attenuator circuit 70 can mitigate peak current scenarios, such as the scenario discussed with FIG. 2. The output audio signal of the attenuator circuit 70 is communicated by a speaker 85 via the digital audio amplifier 80.

Figure 4:
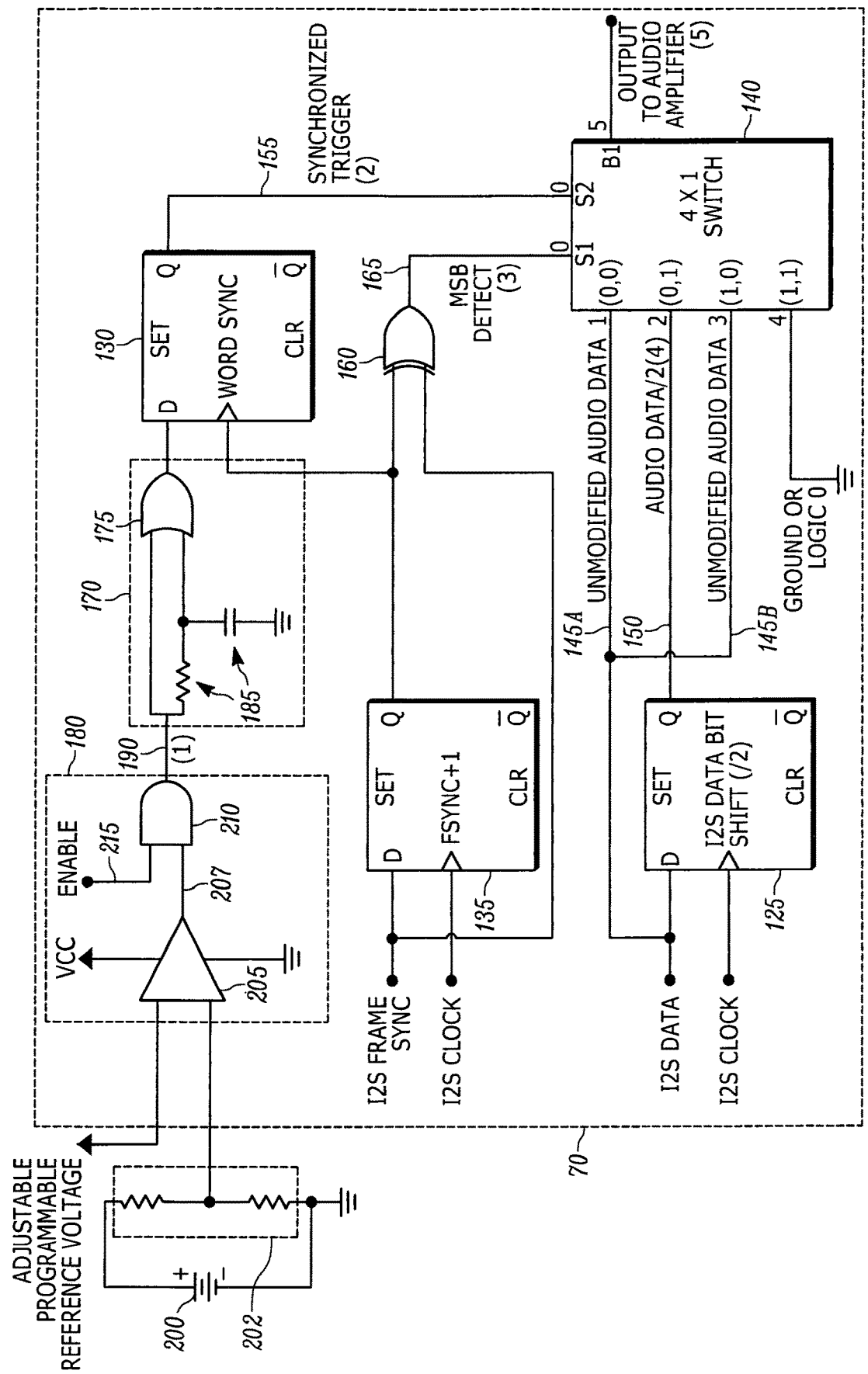
FIG. 4 is an electrical schematic of an attenuator circuit capable of being used in the converged electronic device of FIG. 3.

Referring now to FIG. 4, the figure shows a detailed attenuator circuit 70 capable of being used in the converged electronic device 30 in accordance with an embodiment. The audio signal for FIG. 4 includes an integrated interchip sound (I2S) bitstream. Other digital audio bitstream data schemes, such as pulse-code modulation (PCM), can be used in alternative to the integrated interchip sound bitstream. The attenuator circuit 70 includes three D flip-flops 125, 130, and 135 and a switch 140. The D flip-flops 125, 130, and 135 are identified in FIG. 4 as an I2S data bit shift flip-flop, a word synchronization flip-flop, and a frame synchronization (FSYNC+1) flip-flop, respectively. The switch 140 passes one of a non-attenuated (or unmodified) signal 145A, 145B and an attenuated (or modified) signal 150. The control of the switch 140 is in response to a synchronized trigger signal 155, which can be a logic 0 or a logic 1 from the D flip-flop 130. The attenuated signal results from the non-attenuated signal being provided to the D flip-flop 125. Through the control of the switch 140, the resulting output of the D flip-flop 125 passed by the switch 140 is digitally bit-shifted, which attenuates the non-attenuated signal by one-half.

More specifically, the D flip-flop 125 right shifts audio data, which is the equivalent of attenuating an audio signal by a factor of two, or six (6) decibels of amplitude reduction. The D flip-flop 130 synchronizes the activation of the bit shifter so that the bit shifting starts at the beginning of a word. Synchronizing the activation of the bit shifter reduces unwanted popping or noise sounds that would occur if the circuit changes the audio data mid-word. The D flip-flop 135, with the exclusive OR (XOR) gate 160, detects the first data bit at the beginning of every word. The D flip-flop 135 and exclusive OR gate 160 further controls the output of the switch 140. When audio data is shifted, what was the least significant or last bit in a previous word will be shifted into the most significant or first bit of the next word. To prevent this from occurring, the most significant bit needs to be set to logic 0, or grounded. The output of the D flip-flop 135 and exclusive OR gate 160 is the most significant bit (MSB) detect signal 165.

The input to the D flip-flop 130 is provided by an optional pulse stretching circuit 170. The pulse stretching circuit 170 includes an OR gate 175 connected to the output of the trigger circuit 180. The output of the trigger circuit 180 is also connected to a resistor-capacitor (RC) circuit 185, which provides a second input to the OR gate 175. When the trigger circuit 180 provides a high, trigger signal 190, or logic one, to the pulse stretching circuit 170, the OR gate 175 passes the high, trigger signal 190 to the D flip-flop 130. The high, trigger signal also charges the capacitor of the resistor-capacitor circuit 185. When the trigger signal 190 from the trigger circuit 180 provides a low signal, or logic zero, after the high signal, then that low signal is applied to the OR gate 175. However, the resistor-capacitor circuit 185 continues to provide a high signal for a time period, which continues to pass the high signal for the time period. The inclusion of the pulse stretching circuit 170 prevents nuisance triggering by the attenuator circuit 70, thereby limiting nuisance attenuation. The pulse stretching circuit 170 acts as a time hysteresis element in the event that multiple fast comparator signals are sent within a single bit.

The trigger circuit 180 is connected to a battery 200 and monitors a voltage from the battery 200 via a sensor 202. A comparator 205 evaluates battery voltage drop due to peak currents and can trigger the attenuator circuit 70. The threshold for triggering the attenuator circuit 70 may be the same as or different from the threshold for resetting the converged electronic device 30. A trip signal 207 of the comparator 205 is provided to AND gate 210. The AND gate 210, which can be optional, may have other inputs, such as an enable signal 215. The enable signal can override the trip signal 207. When driven low, all other inputs to the AND gate 210 are ignored. Additional control inputs can be provided to the AND gate 210, including audio volume setting, battery temperature threshold, battery voltage, etc. Alternatively, the AND gate 210 can be accomplished by more complex logic to control the audio attenuator circuit 70. The comparator 205 input level can be adjustable for greater control of the comparator 205. The battery voltage relates to the draw and state of charge on the battery 200. The battery 200 can be a battery pack comprising multiple cells or can be a single battery cell.

Figure 5:
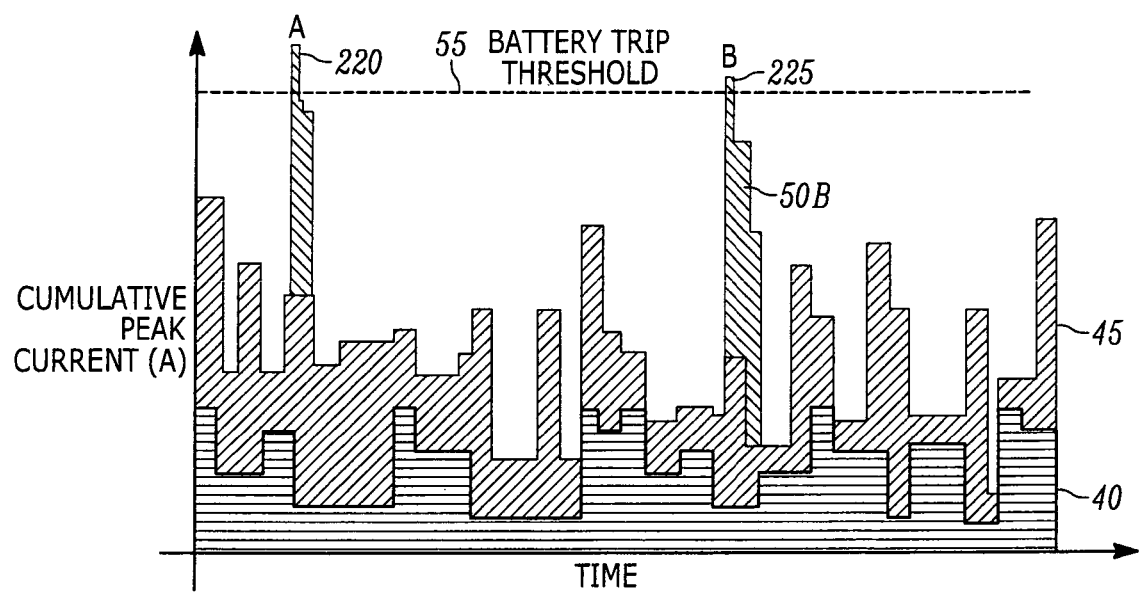
FIG. 5 is a chart showing a cumulative peak current over time for the converged electronic device of FIG. 3 in a hypothetical scenario.

FIG. 5 is a chart showing a cumulative peak current over time for the converged electronic device 30 with the attenuator circuit 70. FIG. 5 shows an improved result over FIG. 2 with the use of the attenuator circuit 70. The lower portion 40 of the cumulative peak current is the current associated with the long-term evolution real-time video call. The middle portion 45 of the cumulative peak current is the current associated with an audio speaker of the converged electronic device 30. The upper portion 50B of the cumulative peak current is the current associated with the land-mobile radio network affiliation event. Also shown in FIG. 5 is the battery trip threshold 55. As discussed previously herein with respect to FIG. 2, the converged electronic device 30 may reset or power down when the cumulative peak current exceeds the battery trip threshold 55 for a defined time period. For example, the time period may be 280 microseconds (μs) and the land-mobile radio network affiliation event might be 40 milliseconds (ms). However, unlike FIG. 2, the inclusion of the attenuator circuit 70 from FIG. 4 reduces audio peaks by six (6) decibels, thereby reducing the current provided to the audio speaker. The attenuator circuit 70 has a small residual time (i.e., latency) while the comparator 205 trips and activates the attenuator circuit 70. As long as the latency is within the time period for resetting the converged electronic device 30, the battery 200 will not be damaged and the converged electronic device 30 will not shut down. The provided times are for demonstration only. At periods 220 and 225 the comparator 205 senses the droop in battery voltage created by the aggregate peak currents of the applications involved and reacts by invoking the audio attenuator circuit 70, which reduces audio peaks by six (6) decibels. This alleviates a potential reset situation.

The attenuator circuit 70 provides a fast responding/low latency circuit and is controlled by the input frame sync of the incoming audio bitstream. For example, in a typical audio bitstream of 48 kilobits-per-second, the max latency of the circuit would be 20 microseconds, well below the battery protection detection circuitry (e.g., 280 microseconds). Performing audio attenuation in software or a digital signal processor would require a microprocessor without interlocked pipeline stages (MIPS) and/or higher latency. The fast responding attenuator circuit 70 of FIG. 4 prevents peak current scenarios which cause battery undervoltage conditions.

Figure 6:
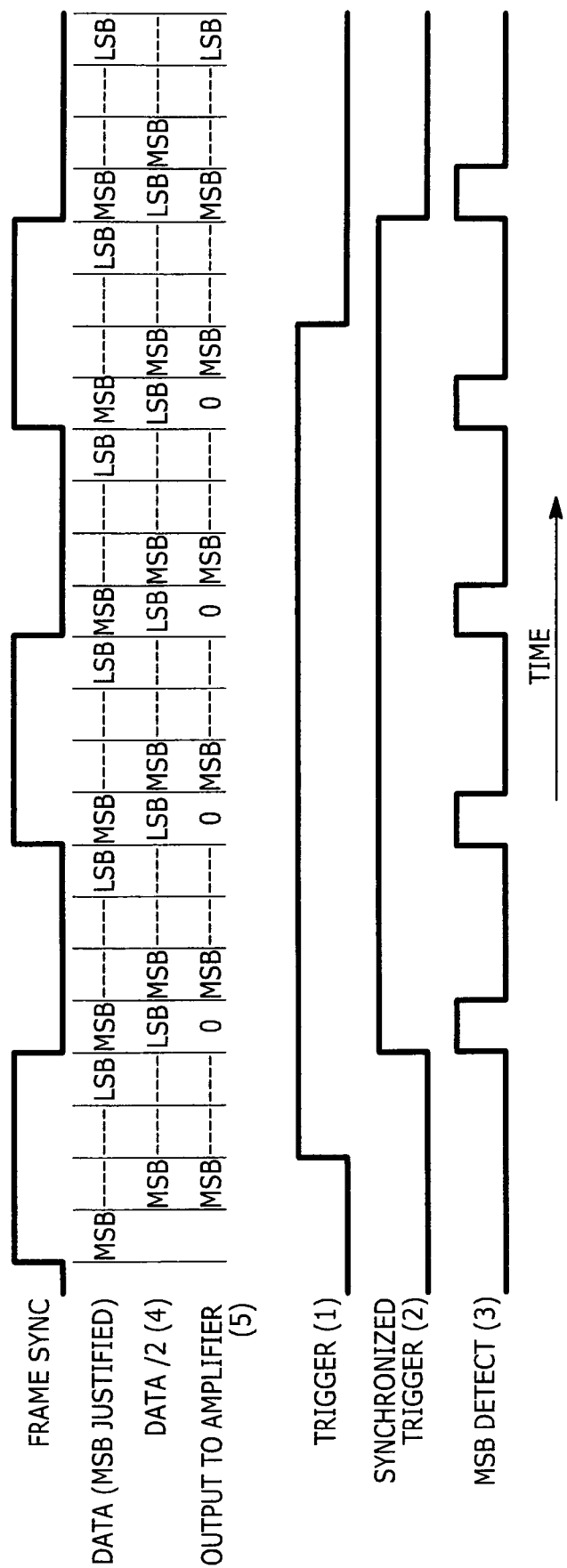
FIG. 6 is a diagram showing an audio data interface over time.

The diagram of FIG. 6 outlines logical flow from the trigger signal 190 (of FIG. 4) to the final output provided to the digital audio amplifier 80 (of FIG. 3). The reference nos. (1) to (5) in FIG. 6 refer to reference nos. (1) to (5) of FIG. 4. The example in FIG. 6 is for most significant bit (MSB) justified integrated interchip sound (I2S) data. The most significant bit detection of FIG. 4 can be modified to work with other formats.

Figure 7:
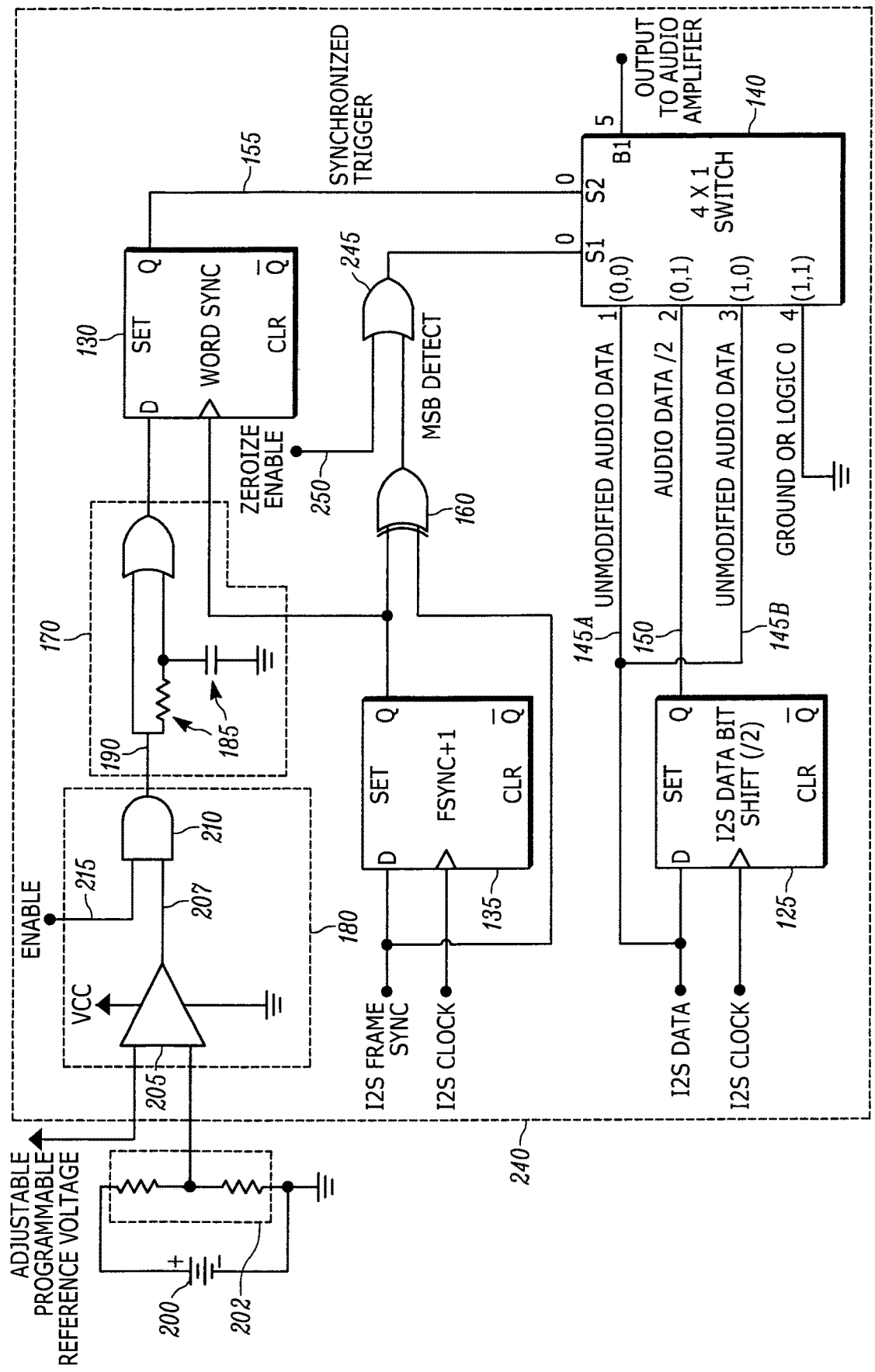
FIG. 7 is an electrical schematic of a second attenuator circuit capable of being used in the converged electronic device of FIG. 3.

FIG. 7 shows a second attenuator circuit 240 for an audio signal in accordance with an embodiment. The second attenuator circuit 240 is substantially identical to the attenuator circuit 70 of FIG. 4, with the addition of an OR gate 245. The OR gate 245 receives the most significant bit detect signal and a zeroize enable signal 250. The OR gate 245 is an option that can be added to the attenuator circuit 70 to select attenuating with the D flip-flop 125 or to completely ground the data line and mute the audio output in response to the zeroize enable signal 250.

Figure 8:
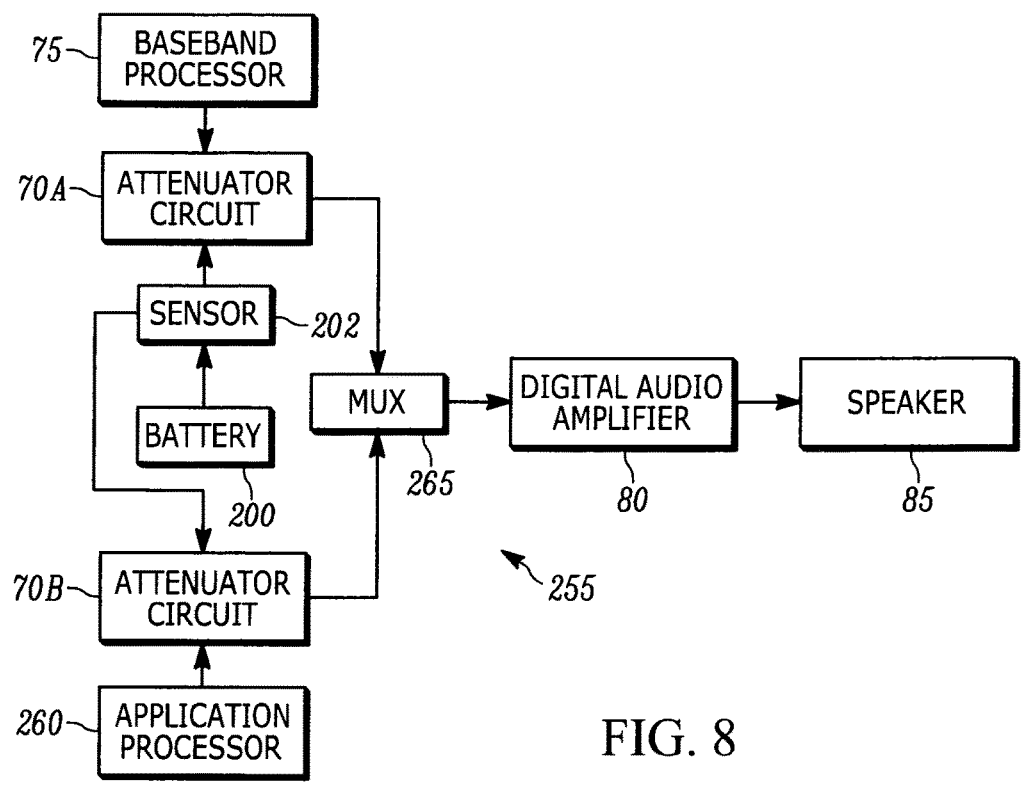
FIG. 8 is a block diagram representing a portion of a second converged electronic device in accordance with some embodiments.
Figure 9:
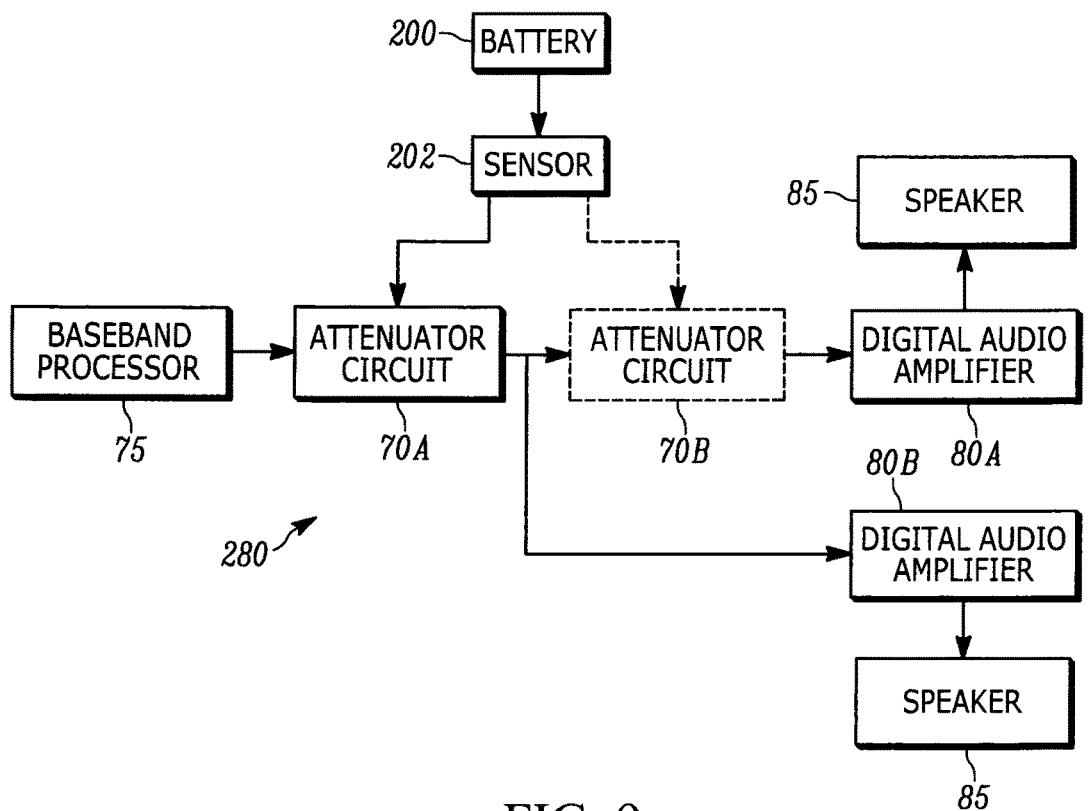
FIG. 9 is a block diagram representing a portion of a third converged electronic device in accordance with some embodiments.

FIG. 8 and FIG. 9 provide two alternative arrangements for using the attenuator circuit 75 in accordance with some embodiments. FIG. 8 provides a multiprocessor system 255 having a baseband processor 70 and an application processor 260. Either processor 75 or 255 may provide an audio signal to the digital audio amplifier 80 via a multiplexor 265. Both the baseband processor 75 and the application processor 260 are coupled to the multiplexor via attenuator circuits 70A and 70B. Digital audio from the two separate sources are individually attenuated. For example, a land mobile radio incoming call may be received while in a long term evolution call. Audio from the long term evolution call can be attenuated during the receipt of the land mobile radio call.

FIG. 9 provides a single processor system 280 with multiple digital audio amplifiers 80A and 80B. With attenuator circuit 70A, both channels are attenuated by six (6) decibels. With attenuator circuit 70B, only one channel is attenuated by six (6) decibels, thereby resulting in 2.5 decibel attenuation. The single processor system 280 shows attenuation for a stereo application, as an example.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A method of controlling an electronic device with an attenuator circuit, the method comprising:
receiving an audio data signal;
monitoring a battery-related parameter of a battery of the electronic device;
determining whether the monitored battery-related parameter traverses a threshold;
attenuating the audio data signal based on the monitored battery-related parameter traversing the threshold by bit-shifting the audio data signal; and
performing an action with the electronic device when the battery-related parameter traverses a second threshold for the battery-related parameter for a first time period,
wherein determining whether the battery-related parameter traverses the threshold and attenuating the audio data signal by bit-shifting the audio signal occurs in a second time period less than the first time period.

2. The method of claim 1, wherein the monitored battery-related parameter includes at least one parameter from the group of a battery voltage, a current associated with the battery, and a battery temperature.

3. The method of claim 1, further comprising receiving an enable signal, wherein bit-shifting the audio data signal is further based on the enable signal.

4. The method of claim 1, further comprising receiving a trip signal when the monitored battery-related parameter traverses the threshold, wherein bit-shifting the audio data signal is based on the trip signal.

5. The method of claim 4, further comprising pulse-stretching the trip signal.

6. The method of claim 1, wherein the threshold and the second threshold are the same.

7. The method of claim 1, wherein the action includes at least one action from the group of resetting the electronic device and shutting down the electronic device.

8. The method of claim 1, further comprising programmably adjusting the threshold.

9. The method of claim 1, further comprising receiving a zeroized signal and grounding the audio data signal based on the received zeroized signal.

10. An attenuator circuit for an electronic device having a battery, the attenuator circuit comprising:
- a sensor to monitor a battery-related parameter of the battery and to provide a sensor signal based on the battery-related parameter;
- a comparator coupled to receive a reference voltage and coupled to the sensor, the comparator to provide a trip signal based on a comparison of the reference voltage and the sensor signal;
- an audio data signal input to receive an audio data signal;
- a bit shifter coupled to the audio data signal input and to provide an attenuated audio data signal by bit-shifting the audio data signal;
- a switch coupled to the audio data signal input, the bit shifter, and the comparator, the switch to pass one of the audio data signal and the attenuated audio data signal based on the trip signal; and
- an audio data signal output coupled to the switch to provide one of the audio data signal and the attenuated audio data signal.

11. The attenuator circuit of claim 10, further comprising an AND gate receiving an enable signal and the trip signal, and the AND gate to provide a trigger signal based on the enable signal and the trip signal, wherein the bit shifter provides the attenuated audio data signal based on the trigger signal.

12. The attenuator circuit of claim 11, wherein the audio data signal includes a word and a frame sync, and the attenuator circuit further comprises a second D flip-flop for providing word synchronization the frame sync and a third D flip-flop for detecting a most significant bit of the word.

13. The attenuator circuit of claim 10, further comprising a pulse stretching circuit coupled to the bit shifter, the pulse stretching circuit including an OR gate and a resistor-capacitor (RC) circuit, the pulse stretching circuit controlling the bit shifter based on the trip signal.

14. The attenuator circuit of claim 10, wherein the bit shifter includes a D flip-flop for bit shifting the audio data signal.

15. An electronic device comprising:
- a battery;
- the attenuator circuit of claim 10 coupled to the battery; and
- a speaker coupled to the attenuator circuit.

* * * * *